US005237131A

United States Patent [19]
Catlin

[11] Patent Number: 5,237,131
[45] Date of Patent: * Aug. 17, 1993

[54] PRINTED CIRCUIT BOARD DESIGN FOR MULTIPLE VERSIONS OF INTEGRATED CIRCUIT DEVICE

[75] Inventor: Robert W. Catlin, Santa Clara, Calif.

[73] Assignee: Chips & Technologies, Inc., San Jose, Calif.

[*] Notice: The portion of the term of this patent subsequent to Oct. 29, 2008 has been disclaimed.

[21] Appl. No.: 783,481

[22] Filed: Oct. 28, 1991

Related U.S. Application Data

[63] Continuation of Ser. No. 592,157, Oct. 3, 1990, Pat. No. 5,061,825.

[51] Int. Cl.$^5$ .............................................. H05K 1/00
[52] U.S. Cl. ..................................... 174/261; 174/262; 174/266; 361/767; 439/68; 439/70
[58] Field of Search ................ 439/55, 65, 68, 70; 361/406, 397, 403; 174/250, 254, 262, 261, 266

[56] References Cited

U.S. PATENT DOCUMENTS

| | | | |
|---|---|---|---|
| 3,780,431 | 12/1973 | Feeney | 174/250 |
| 4,037,047 | 7/1977 | Taylor | 174/250 |
| 4,467,400 | 8/1984 | Stopper | 361/406 |
| 4,854,039 | 8/1989 | Wendt | 174/250 |
| 5,061,825 | 10/1991 | Catlin | 174/261 |
| 5,098,311 | 3/1992 | Roath et al. | 439/289 |

Primary Examiner—Leo P. Picard
Assistant Examiner—Cheryl R. Figlin
Attorney, Agent, or Firm—Townsend and Townsend

[57] ABSTRACT

A printed circuit board design capable of accepting both first and second versions of an IC device. First and second IC devices (10, 20) have pins disposed along respective first and second rectangular peripheries (12a-b and 15a-b; 22a-b and 23a-b). Each pin on the first IC device has a functional counterpart pin on the second IC device. The board configuration contains pads in first and second arrays (32a-b and 35a-b; 32a, 32c, 33a-b) that correspond to the pins on the first and second IC devices. At least some of the pads (32b) of the first array do not physically coincide with pads in the second array and are located within the rectangle defined by the second array. Each non-overlapping pad in the first array is connected by a circuit board trace (40) to a respective pad in the second array such that each circuit board trace joins two pads corresponding to counterpart pins.

3 Claims, 1 Drawing Sheet

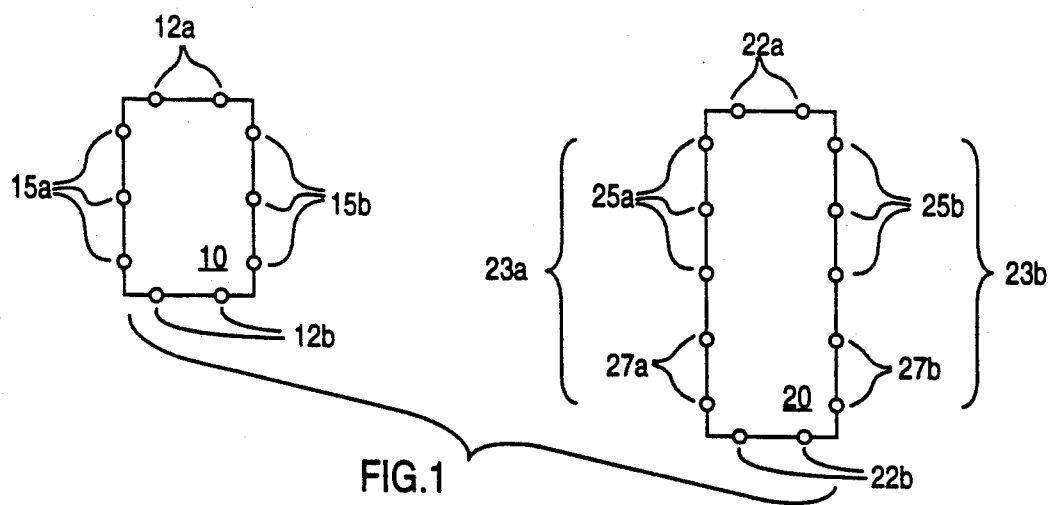
FIG. 1
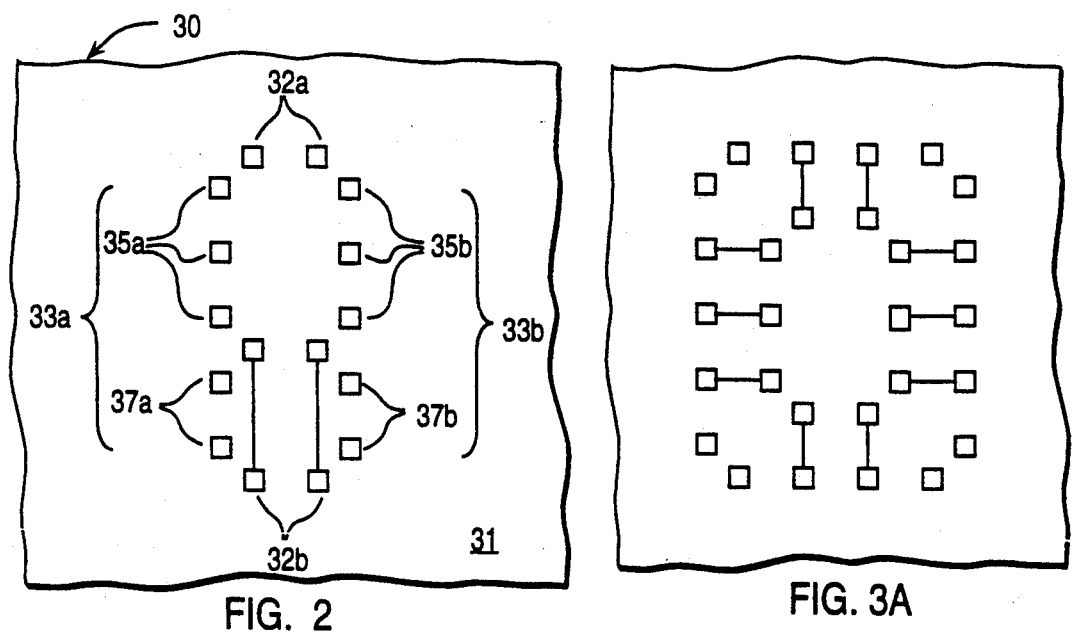
FIG. 2
FIG. 3A
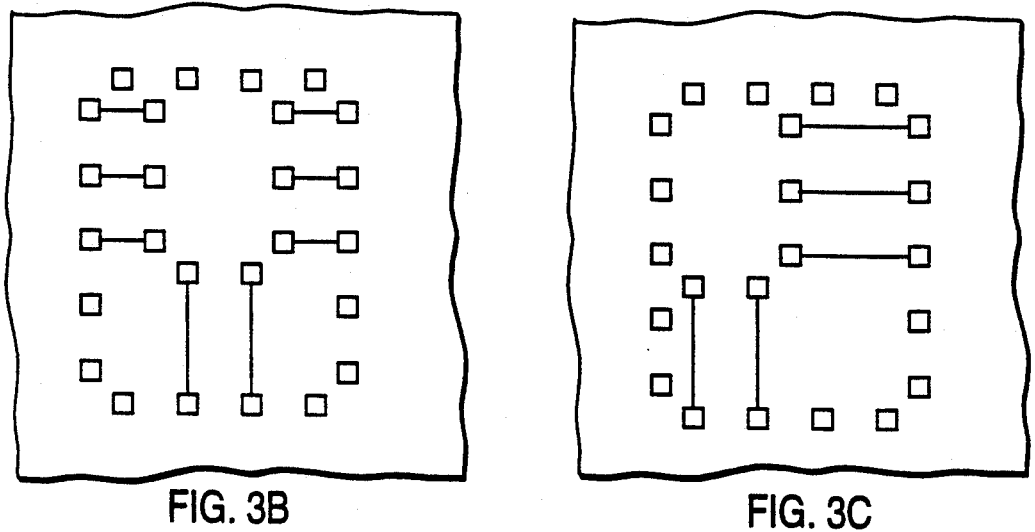
FIG. 3B
FIG. 3C

PRINTED CIRCUIT BOARD DESIGN FOR MULTIPLE VERSIONS OF INTEGRATED CIRCUIT DEVICE

This is a continuation of application Ser. No. 07/592,157 filed Oct. 3, 1990 U.S. Pat. No. 5,061,825.

BACKGROUND OF THE INVENTION

The present invention relates to techniques for configuring printed circuit (PC) boards.

One common type of integrated circuit (IC) device packaging technique provides pins around a rectangular package perimeter. The pins may be bent perpendicular to the plane of the chip and soldered into holes in the PC board (referred to as through-hole mount), or may be bent with the ends of the pins parallel to the plane of the chip and soldered to pads on the board surface (referred to as surface-mount). However, IC devices are constantly evolving, and may it may be desirable for a later generation of an IC device to include additional circuitry for new features, diagnostics, or perhaps operation in multiple modes. In many such cases, the new IC device will require more pins than the old IC device.

This creates problems for a board manufacturer who wishes to offer products based on both versions of the IC device. Clearly, the existing board that was designed to accommodate the old version will not accommodate the new version. Equally serious, however, is the problem that a new circuit board, designed for the new version, will not accommodate the old version. Thus the manufacturer is confronted with having to maintain two boards in inventory, which is undesirable.

SUMMARY OF THE INVENTION

The present invention provides a printed circuit board design capable of accepting both first and second versions of an IC device. The invention provides an efficient board layout while obviating the need for two or more boards.

The invention presupposes first and second IC devices, having pins disposed along respective first and second rectangular peripheries. The second IC device is assumed to have more pins, and thus its rectangle is larger than the first in at least one dimension. Each pin on the first IC device has a functional counterpart pin on the second IC device.

The board configuration contains a set of pads to accommodate both IC device versions. The pads can be considered to lie in first and second arrays that correspond to the pins on the first and second IC devices. At least some of the pads of the first array do not physically coincide with pads in the second array and are located within the rectangle defined by the second array. Each non-overlapping pad in the first array is connected by a circuit board trace to a respective pad in the second array such that each circuit board trace joins two pads corresponding to counterpart pins.

In a specific embodiment, the first IC device has two rows of M pins and two columns of N pins, and the second IC device has two rows of M pins, and two columns of (N+D) pins. The first array includes first and second rows of M pads each and first and second columns of N pads each, laid out in the M-by-N rectangular configuration of the first IC device. The second array includes first and second rows of M pads each and first and second columns of (N+D) pads each, laid out in the M-by-(N+D) rectangular configuration of the second IC device.

The first row and both columns of the first array coincide with counterpart portions of the second array while the second row is non-overlapping and located inside the second array. Counterpart pads in the second rows of the two arrays are connected to each other by respective circuit board traces.

A further understanding of the nature and advantages of the present invention may be realized by reference to the remaining portions of the specification and drawings.

BRIEF DESCRIPTION OF THE DRAWINGS

FIG. 1 is a schematic view showing first and second IC devices;

FIG. 2 is a schematic view showing a region of a PC board adapted to accommodate either of the two devices; and FIGS. 3A, 3B, and 3C show PC board layouts for alternative embodiments.

DESCRIPTION OF SPECIFIC EMBODIMENTS

FIG. 1 is a schematic view showing the pin arrangements for first and second IC devices, each of which is contained in a package that provides pins disposed about a rectangular periphery. In particular, a first IC device 10 includes a first row of M pins 12a, a second row of M pins 12b, a first column of N pins 15a, and a second column of N pins 15b. A second IC device 20 includes a first row of M pins 22a, a second row of M pins 22b, a first column of (N+D) pins 23a, and a second column of (N+D) pins 23b. Pins 23a in the first column include a group of N pins 25a and a group of D pins 27a. Similarly, the second column includes a group of N pins 25b and a group of D pins 27b. Normally, the pins in each row and column are equally spaced.

IC devices 10 and 20 are compatible in the sense that pins 12a are functional counterparts of pins 22a, pins 12b are counterparts of pins 22b, pins 15a are counterparts of pins 25a, and pins 15b are counterparts of pins 25b. Pins 27a and 27b represent pins that are needed to implement additional features present in IC device 20, and have no counterparts in IC device 10.

While the schematic figure shows relatively small numbers of pins, it should be understood that a typical VLSI device package could have 25 or more pins in each of its rows and columns. Furthermore, in many instances the manufacturer of the IC device will specify that certain pins are not to be connected to any off-chip circuit elements. Such pins may be for test purposes, or may merely reflect the manufacturer's desire to use a standard sized package.

FIG. 2 is a schematic illustrating a region of a printed circuit (PC) board 30 having a substrate 31 on which are located mounting pads to accommodate both of the two IC device configurations described above. In this regard it should be noted that the term "pad" is used generically to refer to a plated hole for through-hole mounted devices or a surface pad for surface-mount devices.

The relevant region of the PC board includes an overall set of pads that includes first and second arrays corresponding to the first and second IC devices. For the specific IC devices shown in FIG. 1, the overall set of pads in FIG. 2 includes first, second, and third rows containing pads 32a, 32b, and 32c, each row having M pads, and first and second columns containing pads 33a and 33*b*, each column having (N+D) pads. The first column includes a first column portion of N pads 35*a* and a second column portion of D pads 37*a*. Similarly, the second column contains a first column portion of N pads 35*b* and a second column portion of D pads 37*b*.

Pads 32*a* and 32*c*, and 33*a* and 33*b* are configured to accommodate the pins on IC device 20. Pads 32*b* are located between the first and second rows at a distance so that they accommodate pins 12*b* when IC device 10 is mounted with pins 12*a* on pads 32*a*, pins 15*a* on pads 35*a*, and pins 15*b* on pads 35*b*. A plurality of M circuit board traces 40 connect respective ones of pads 32*b* and 32*c*.

For simplicity, the board is illustrated without the board traces that connect the chip to other circuitry. In a typical embodiment, the traces for the second row of pins on the IC devices lead to pads 32*c*, the traces for the remaining pins on the first IC device lead to pads 32*a*, 35*a*, and 35*b*, and the traces for the new pins on the second IC device lead to pads 37*a* and 37*b*.

The present invention requires that the pin configuration is such that the row containing pins 12*b* is not so long that the outermost pair of pads 32*b* are too close to pads 37*a* and 37*b*. This requirement is normally met by standard Quad Flat Pack (QFP) packages.

The specific embodiment described above is a special case where IC device 20 is taller but no wider than IC device 10. In this case, the array of pads for IC device 10 overlaps the array for IC device 20 on three of the former's four sides. Thus, the second row of pads for IC device 10 are the only pads that don't coincide with pads that accommodate IC device 20.

In general, there will be at least some pads for the first IC device that don't coincide with pads for the second IC device. In principle, depending on the respective pinouts, there may be coincidence on zero, one, two, or three sides. FIGS. 3A, 3B, and 3C show board layouts for the three possible cases where the second IC device is both taller and wider than the first IC device. FIG. 3A shows the case where the first array is located entirely within the second (no coincidence), and has circuit board traces extending from all four sides of the first array. FIG. 3B shows coincidence on one side so that circuit board traces extend from three sides. FIG. 3C shows coincidence on two sides so that traces extend from two sides.

In conclusion, it can be seen that the present invention provides a simple and elegant PC board configuration that accommodates different generations of an IC device with no wasted board overhead.

While the above is a complete description of a number of embodiments, various modifications, alternatives, and equivalents may be used. For example, while the circuit board traces for the second row of pins on IC devices 10 and 20 are described as leading to pads 32*c*, other routing considerations might make it preferable for those traces to lead to pads 32*b*. Additionally, IC devices 10 and 20 are shown as having identical pinouts on three sides. However, the pins on IC 20 that are counterparts of pins 15*a* and 15*b* could as well have been located in the central region of the columns so that separate pads would be required for pins 12*a*.

Therefore, the above description should not be taken as limiting the scope of the invention which is defined by the appended claims.

What is claimed is:

1. A printed circuit board for accepting either of first and second integrated circuit devices, the first and second devices having pins in respective first and second configurations with each of the first and second devices having at least some pins, called counterpart pins, that are functionally equivalent to pins on the other device, comprising:

a first array of pin-engaging elements, said first array being disposed according to the first configuration so as to match the pins of the first device;

a second array of pin-engaging elements, said second array being disposed according to the second configuration so as to match the pins of the second device;

said first and second arrays being related such that said first array has a particular number of pin-engaging elements, designated non-overlapping counterpart pin-engaging elements, that do not physically coincide with pin-engaging elements of said second array and that correspond to counterpart pins on the first device; and a corresponding particular number of connectors, each connecting a respective non-overlapping counterpart pin-engaging element in said first array with a respective pin-engaging element in said second array, wherein each connector connects two pin-engaging elements that correspond to counterpart pins.

2. The circuit board of claim 1 wherein the pin-engaging elements are pads configured to receive surface-mount devices.

3. The printed circuit board of claim 1 wherein said first and second arrays have at least some coincident pin-engaging elements.

* * * * *